United States Patent [19]

Jayaraman

[11] Patent Number: 5,754,578
[45] Date of Patent: *May 19, 1998

[54] 1250-1650 NM VERTICAL CAVITY SURFACE EMITTING LASER PUMPED BY A 700-1050 NM VERTICAL CAVITY SURFACE EMITTING LASER

[75] Inventor: Vijaysekhar Jayaraman, Goleta, Calif.

[73] Assignee: W. L. Gore & Associates, Inc., Newark, Del.

[*] Notice: The term of this patent shall not extend beyond the expiration date of Pat. No. 5,513,204.

[21] Appl. No.: 670,892

[22] Filed: Jun. 24, 1996

[51] Int. Cl.$^6$ ............................... H01S 3/19; H01S 3/094
[52] U.S. Cl. ................... 372/50; 372/96; 372/75
[58] Field of Search ........................ 372/75, 96, 92, 372/45, 46, 21, 22, 50

[56] References Cited

U.S. PATENT DOCUMENTS 5,513,204  4/1996  Jayaraman ........................ 372/75

OTHER PUBLICATIONS

Lin et al., "Photopumped Long Wavelength Vertical–Cavity Surface–Emitting Lasers Using Strain–Compensated Multiple Quantum Wells", Appl. Phys. Lett. vol. 64, Jun. 20, 1994, pp. 3395–3397.

McDaniels, Jr. et al., "Vertical Cavity Surface–Emitting Semiconductor Laser with CW Injector Laser Pumping", IEEE, 1990, pp.156–158.

Article –McDaniel et al., "Vertical Cavity Surface–Emitting Semiconductor Laser with CW Injection Laser Pumping", IEEE Photonics Tech. Lett., 2 (3) (Mar. 1990) 156–158.

Article –Lin et al. "Photopumped Long Wavelength Vertical–Cavity Surface–Emitting Lasers Using Strain–Compensated Multiple Quantum Wells" Appl. Ohys. Lett. 64 (25) (20 Jun. 1994) 3395–3397.

*Primary Examiner*—Rodney B. Bovernick
*Assistant Examiner*—Ellen E. Kang
*Attorney, Agent, or Firm*—Victor M. Genco, Jr.

[57] ABSTRACT

An electrically-pumped short wavelength vertical cavity surface emitting laser (VCSEL) is optically coupled to a long wavelength VCSEL for optically pumping the long wavelength VCSEL. The long wavelength VCSEL has a long wavelength active-absorber medium interposed between a top long wavelength mirror and a bottom long wavelength mirror. The long wavelength VCSEL emits radiation at a first wavelength in a range from 1250 nm to 1650 nm. The short wavelength VCSEL emits radiation at a second wavelength in a range from 700 nm to 1050 nm.

23 Claims, 6 Drawing Sheets

1250-1650 NM VERTICAL CAVITY SURFACE EMITTING LASER PUMPED BY A 700-1050 NM VERTICAL CAVITY SURFACE EMITTING LASER

FIELD OF THE INVENTION

This invention relates generally to integrated semiconductor lasers; and more particularly to an optically pumped long-wavelength vertical cavity surface emitting laser.

BACKGROUND OF THE INVENTION

A Vertical Cavity Surface Emitting Laser (VCSEL) is a semiconductor laser including a semiconductor layer of optically active material, such as gallium arsenide or indium phosphide, sandwiched (usually in stacks) between mirrors formed of highly-reflective layers of metallic material, dielectric material, epitaxially-grown semiconductor dielectric material or combinations thereof. Conventionally, one of the mirror stacks is partially reflective so as to pass a portion of the coherent light which builds up in a resonating cavity, which is formed by the active layer sandwiched between the mirror stacks.

Lasing structures require optical confinement in a cavity and carrier confinement to achieve efficient conversion of pumping electrons into stimulated photons through population inversion. The standing wave of reflected electromagnetic energy in the resonating cavity has a characteristic cross-section giving rise to an electromagnetic mode. A desirable electro-magnetic mode is the single fundamental mode, for example, the $HE_{11}$ mode of a cylindrical waveguide. A single mode signal from a VCSEL is easily coupled into an optical fiber, has low divergence, and is inherently single frequency in operation.

The total gain of a VCSEL must equal the total loss of the VCSEL in order to reach the lasing threshold. Unfortunately, due to the compact nature of VCSELs, the gain media is quite limited. For efficient VCSELs, at least one of the two required mirrors must have a reflectivity greater than approximately 99.5%. It is more difficult to meet this requirement in long-wavelength VCSELs than in short wavelength VCSELs, because such high reflectivity mirrors are difficult to grow in the same epitaxial step as the long-wavelength active region.

For example, in a 980 nanometer GaAs VCSEL the mirrors can be grown using alternating layers of GaAs and AlGaAs. Since the refractive index difference between these two materials is 0.6, very few layers are required to form a suitable mirror. An analogous mirror design for a 1300 or 1550 nanometer VCSEL would use alternating layers of InP and InGaAsP. In this case, however, the refractive index difference is approximately 0.23. As a result, an InP/InGaAsP mirror must be much thicker to achieve the same reflectivity as a GaAs/AlGaAs mirror. Increasing thickness, however, is not practicable since both absorption and diffraction losses also increase, which ultimately limits the maximum achievable reflectivity. Therefore, for long wavelength VCSELs, the mirrors are formed of either evaporated dielectrics or lattice mismatched semiconductors.

Figure 1:
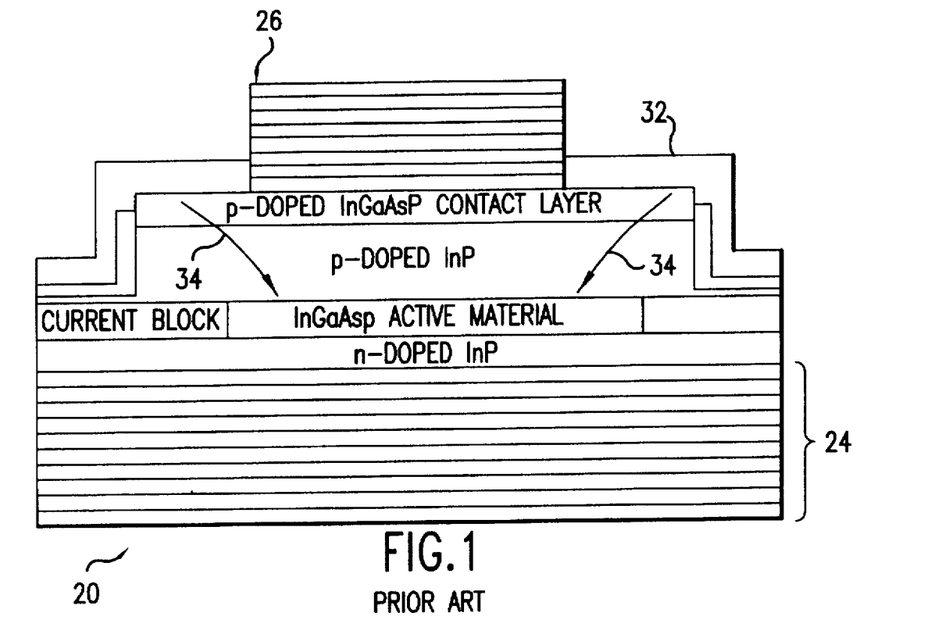
FIG. 1 is a schematic representation of a prior art electrically injected VCSEL with a top dielectric mirror.
Figure 2:
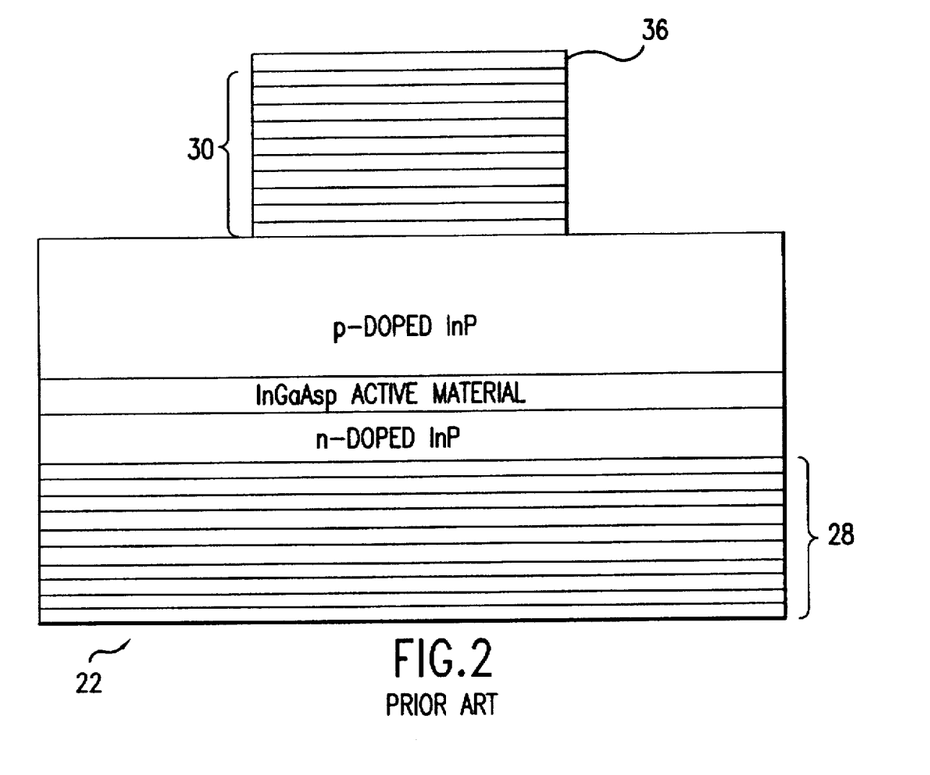
FIG. 2 is a schematic representation of a prior art electrically injected VCSEL with two wafer-fused GaAs/AlGaAs mirrors.

Two previously practiced mirror combinations are illustrated in the VCSEL structures 20, 22 shown in FIGS. 1 and 2. In VCSEL structure 20 (FIG. 1), at least one wafer-fused GaAs/AlAs mirror 24, which has a larger index difference than InP/InGaAsP, is used. In wafer fusion, semiconductors of differing lattice constants are atomically joined by applying mechanical pressure and heat. An electrically insulating dielectric mirror 26 is used as the top mirror in VCSEL structure 20. VCSEL structure 22 (FIG. 2) includes a wafer-fused GaAs/AlAs mirror 28, which has a larger index difference than InP/InGaAsP. A second wafer-fused GaAs/AlGaAs mirror 30 is used as the top mirror in VCSEL structure 22.

The VCSEL structures 20, 22 shown in FIGS. 1 and 2 suffer from several problems associated with electrical injection of charge carriers into the active region. VCSEL structure 20 (FIG. 1) has an insulating dielectric top mirror 26, thus requiring a metal ring contact 32 and injection around dielectric mirror 26 along the injection path 34. This contacting and injection scheme results in a complicated fabrication procedure. VCSEL structure 22 (FIG. 2) uses injection through a conducting top mirror 30 with metal contact 36. Mirror 30, however, is typically resistive and introduces significant resistive heating. Since the optical efficiency of materials such as InP and InGaAsP are known to degrade rapidly with temperature, the resistive heating will limit the output power of the device. Finally, VCSEL structures 20 and 22 as well as any other electrically injected VCSELs require p and n dopants inside the optical cavity. The dopants introduce further optical loss which ultimately limits the output power.

An alternative to electrical pumping is optical pumping. An optical pumping approach that has been used on a short wavelength VCSEL operating at 860 nanometers was described by McDaniel et al. in an article entitled *Vertical Cavity Surface-Emitting Semiconductor Laser with CW Injection Laser Pumping*, IEEE Photonics Tech. Lett., 2 (3) (March 1990) 156–158. The authors used an array of in-plane semiconductor lasers as a pump source for a single short wavelength VCSEL.

In a different optical pumping approach, Lin et al. demonstrate a long wavelength VCSEL structure consisting of 30 pairs of compressive strained wells and tensile strained barriers and $Si/SiO_2$ dielectric mirrors optically pumped with a mode-locked Ti-sapphire laser. *Photopumped Long Wavelength Vertical-Cavity Surface-Emitting Lasers Using Strain-Compensated Multiple Quantum Wells*, Appl. Ohys. Lett. 64 (25) (20 Jun. 1994) 3395–3397.

Neither of the above approaches, nor any other known approach using an in-plane semiconductor laser, dye laser, or solid-state laser pump, is practical for commercial advantage over in-plane semiconductor lasers.

SUMMARY OF THE INVENTION

Optically pumping long wavelength VCSELs according to the principles of the invention avoid complex fabrication, resistive heating, and dopant-induced losses associated with electrical pumping. A long wavelength VCSEL is optically coupled to and optically pumped by an underlying or overlaying shorter wavelength VCSEL. The short wavelength VCSEL is electrically pumped to emit radiation in a wavelength range of 700 nm–1050 nm, which optically pumps the longer wavelength VCSEL to emit radiation in a wavelength range of 1250 nm–1650 nm. In a first arrangement, short wavelength radiation emitted from the bottom surface of an overlying short-wavelength VCSEL is transmitted through the upper mirror of the long-wavelength VCSEL. The upper mirror of the long-wavelength VCSEL is grown in the same epitaxial step as the short wavelength VCSEL and is made from the GaAs/AlGaAs system (i.e., containing some combination of AlAs (aluminum arsenide), GaAs (gallium arsenide), or AlGaAs (aluminum gallium arsenide)). Long-wavelength radiation is emitted from either the top or bottom surface of the long-wavelength VCSEL.

In a first exemplary embodiment of the first arrangement, the mirrors of both the shorter wavelength VCSEL and the longer wavelength VCSEL are fabricated from the GaAs/AlGaAs system. The fabrication employs two wafer fusion steps.

In a second exemplary embodiment of the first arrangement, the bottom long-wavelength mirror of the long wavelength VCSEL is fabricated from the InP/InGaAsP system or the InP/InGaAlAs system and, is grown in the same epitaxial step as the long-wavelength active-absorber material. The upper mirror, which is grown in the same epitaxial step as the short wavelength VCSEL, is attached to the long-wavelength active-absorber material by wafer-fusion. The remaining mirrors of the long wavelength VCSEL and the short wavelength VCSEL are fabricated from the GaAs/AlGaAs system.

In a third exemplary embodiment of the first arrangement, the long-wavelength active-absorber material is attached to its upper GaAs/AlGaAs mirror by metal bonding. The other long-wavelength mirror can be either an epitaxially grown InP/InGaAsP or InP/InGaAlAs mirror, a wafer-fused GaAs/AlGaAs mirror, or a metal-bonded GaAs/AlGaAs mirror.

In a second arrangement, short wavelength radiation emitted from the top surface of an underlying short-wavelength VCSEL is transmitted through the lower mirror of the long-wavelength VCSEL. The lower mirror of the long-wavelength VCSEL is grown in the same epitaxial step as the short-wavelength VCSEL, and is fabricated from the GaAs/AlGaAs system.

In an exemplary embodiment of the second arrangement, all the mirrors in the structure are from the GaAs/AlGaAs system, except for the top mirror of the long-wavelength VCSEL. The top mirror of the long-wavelength VCSEL can be (1) a wafer-fused GaAs/AlGaAs mirror, (2) an epitaxially grown InP/InGaAsP or InP/InGaAlAs mirror, or (3) a sputtered or evaporated dielectric mirror. Any of these three mirrors can include a metal reflector at the top of the stack to increase reflectivity.

Other aspects and advantages of the invention will become apparent from the following detailed description and accompanying drawings, illustrating by way of example the features of the invention.

DETAILED DESCRIPTION OF THE PREFERRED EMBODIMENT

Light injection into the active region of a VCSEL at a wavelength shorter than the desired emission wavelength is an alternative to electrical injection of charge carriers into the active region of the VCSEL. The injected light is absorbed in the long wavelength cavity, generating electrons and holes. These charge carriers re-combine and re-emit at the longer wavelength.

Figure 3:
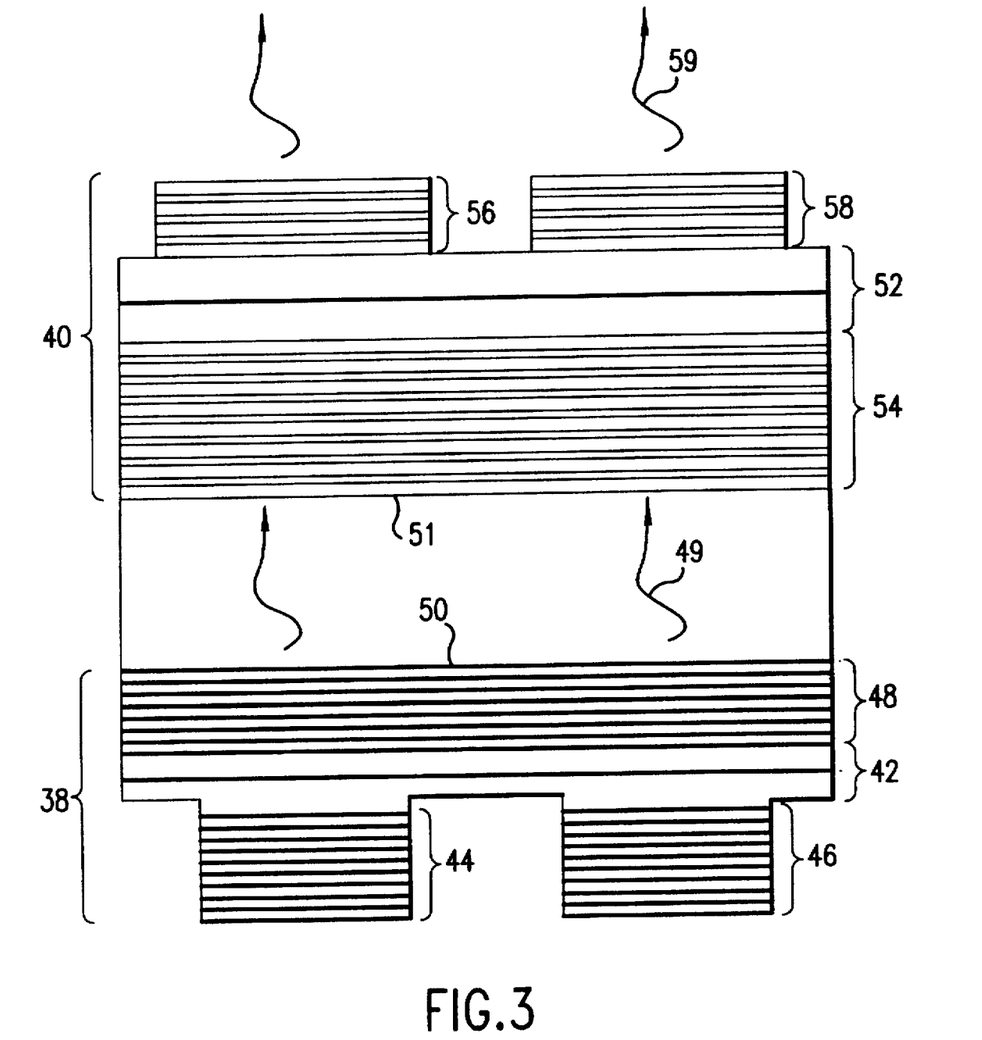
FIG. 3 is a schematic representation of an optically pumped VCSEL according to the principles of the invention.

FIG. 3. is a schematic representation of two short wavelength VCSELs 38 optically pumping two long wavelength VCSELs 40. The configuration depicts the wafer-scale nature of the fabrication technology, which can be used to make single devices including one short wavelength VCSEL pumping one long wavelength VCSEL, and can also be used to make large one and two dimensional arrays.

VCSELs 38 are a pair of electrically pumped, short wavelength VCSELs. The pair include a short wavelength active region 42 interposed between short wavelength mirrors 44, 46, 48. Short wavelength radiation 49 is emitted from a top surface 50 of VCSELs 38 into the bottom surface 51 of a second pair of VCSELs 40. VCSELs 40 are a pair of long wavelength VCSELs including a long wavelength active region 52 interposed between a bottom mirror 54 and top mirrors 56, 58. Mirrors 54, 56, 58 are long wavelength mirrors. Mirror 54 is transparent to the short wavelength radiation 49 emitted by VCSELs 38. Long wavelength radiation 59 is emitted from top mirrors 56, 58. The short wavelength VCSEL bottom mirrors 44, 46 and the long wavelength VCSEL top mirrors 56, 58 are vertically etched to form cylindrical posts. These posts divide the initially planar wafer into many laterally-disposed refractive index guided devices. Index guiding is known in the art, and can be accomplished by chemical etching, lateral oxidation, or implantation.

Specific embodiments of the invention are described with reference to FIGS. 4–7. In this description, "top" or "upper" refers to the side of the VCSEL structure that is away from the substrate. "Bottom" and "lower" mean toward the substrate.

Figure 4:
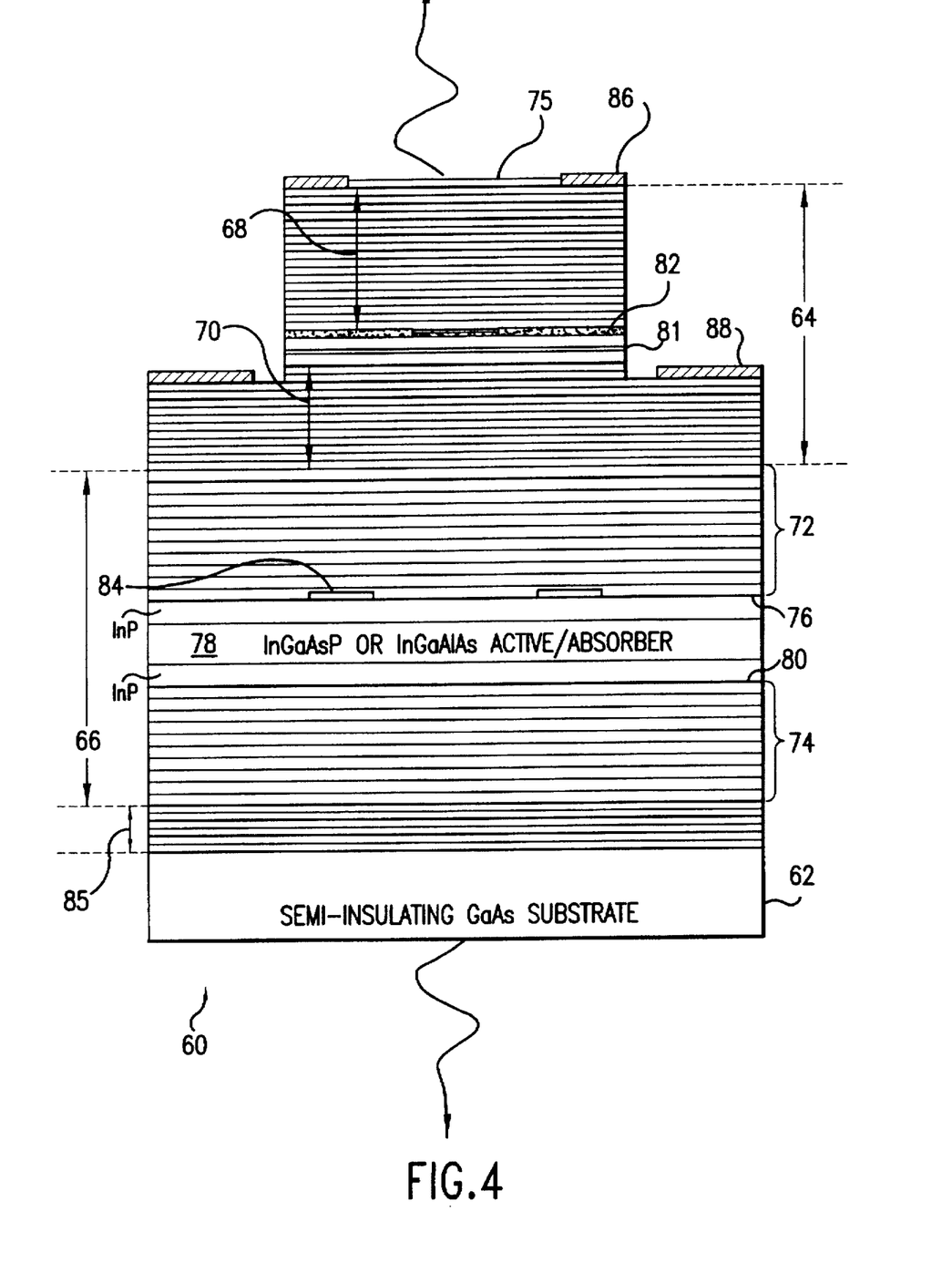
FIG. 4 is a schematic representation of a double-fused optically pumped long wavelength VCSEL according to the principles of the invention.

Referring to FIG. 4, a laser 60 includes a GaAs substrate 62. A short wavelength VCSEL 64 emitting in a wavelength range of 700 nm–1050 nm optically pumps a longer wavelength (1250 nm–1650 nm) VCSEL 66. The short wavelength VCSEL 64 and the long wavelength VCSEL 66 each have a top and a bottom mirror. The short wavelength top and bottom mirrors 68, 70, and the long wavelength top and bottom mirrors 72, 74 are fabricated from the GaAs/AlGaAs system, which means that they contain some combination of AlAs (aluminum arsenide). GaAs (gallium arsenide), or AlGaAs (aluminum gallium arsenide, in which the proportion of aluminum to gallium can be any selected value). The top mirror 72 of the long-wavelength VCSEL is grown in the same epitaxial growth step as the short wavelength VCSEL 64 is grown. A long-wavelength anti-reflection coating 75 is applied to the top short wavelength mirror 68.

The fabrication of the laser 60 employs two wafer fusion steps. The laser 60 has a wafer-fused interface 76 between the top long wavelength mirror 72 and the active-absorber medium 78 and a wafer-fused interface 80 between the active-absorber medium 78 and the bottom long wavelength mirror 74. The long-wavelength active-absorber medium 78 between the two wafer-fused interfaces 76, 80 consists of materials from the group InP (Indium Phosphide), InGaAsP (Indium Gallium Arsenide Phosphide), and InGaAlAs (Indium gallium aluminum arsenide).

The short-wavelength VCSEL 64 includes an active region 81 and can use either etched-posting, implantation, or oxidization for current confinement. The short-wavelength VCSEL 64 preferably has current confinement provided by lateral oxidation 82 with $Al_xGa_yO_z$. The long-wavelength VCSEL 66 is "index-guided". The preferred method for accomplishing this is by etching grooves 84 at the interface 76 between the top long-wavelength mirror 72 and the active-absorber medium 78 prior to the wafer fusion steps ("patterned fusion"). It is also possible that the long-wavelength VCSEL 66 could be index-guided through lateral oxidation, as the short wavelength VCSEL 64 is, but that is not preferred. An optional short-wavelength mirror 85 can be interposed between the bottom long-wavelength mirror 74 and the substrate 62.

The short wavelength VCSEL 64 is a bottom-emitting VCSEL (i.e., a majority of the power is directed toward the substrate 62), while the long-wavelength VCSEL 66 can be either a top-emitting VCSEL or a bottom-emitting VCSEL. Both p and n metal contacts 86, 88 to the short wavelength VCSEL 64 are made above, rather than below, the long-wavelength VCSEL 66.

Figure 5:
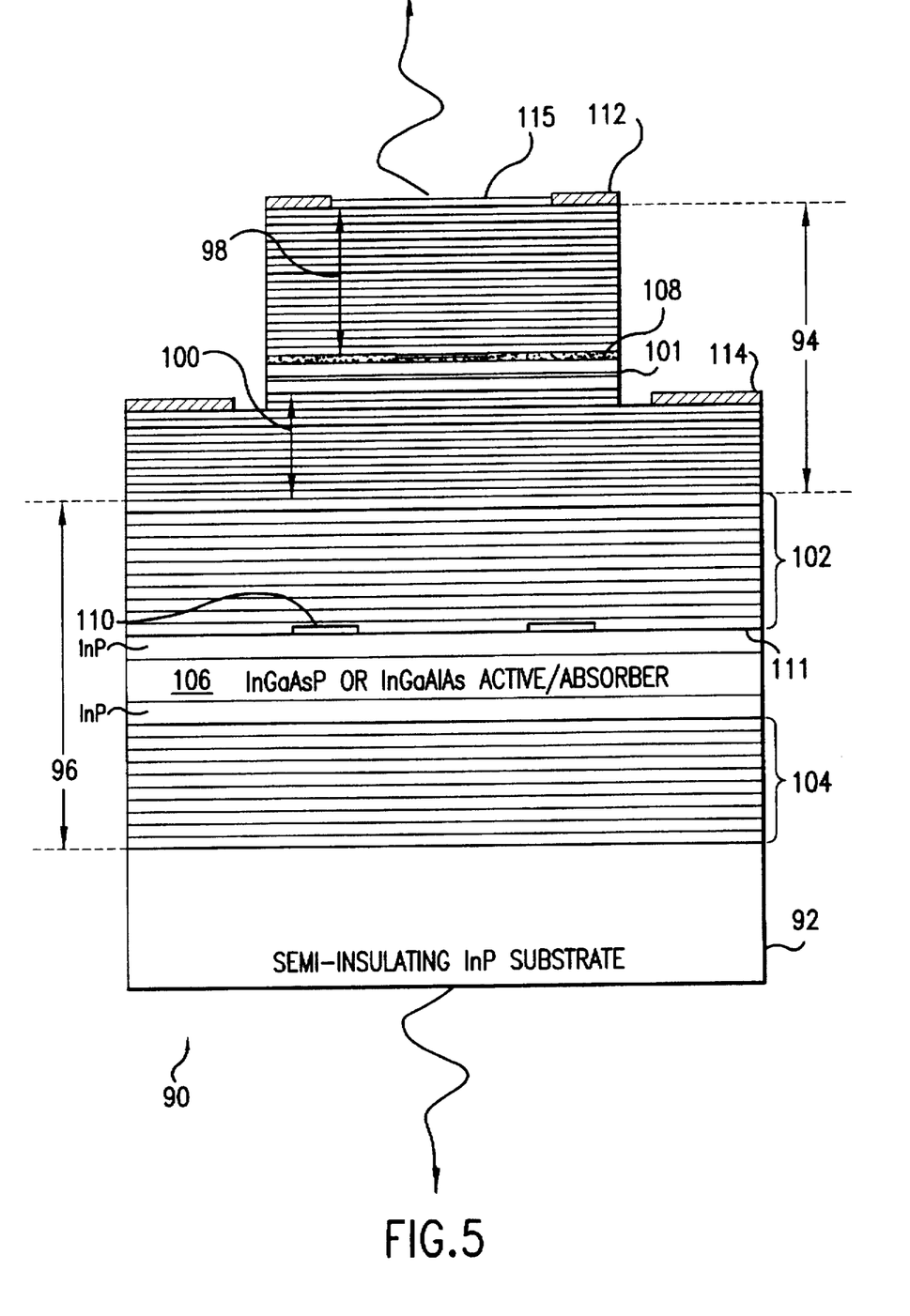
FIG. 5 is a schematic representation of an optically pumped long wavelength VCSEL with one fused mirror and one mirror epitaxially grown with a long-wavelength active/absorber medium according to the principles of the invention.

Referring to FIG. 5, a laser 90 includes an InP substrate 92. A short wavelength VCSEL 94 which emits in the wavelength range 700 nm–1050 nm optically pumps a longer wavelength (1250 nm–1650 nm) VCSEL 96. The short wavelength VCSEL 94 includes a top mirror 98, a bottom mirror 100, and a short wavelength active region 101. The long wavelength VCSEL 96 includes a top mirror 102 and a bottom mirror 104. The bottom long-wavelength mirror 104 is from the InP/InGaAsP system or InP/InGaAlAs system, and is grown in the same epitaxial step as the long-wavelength active-absorber material 106 disposed above the bottom long-wavelength mirror 104. The top mirror 102 of the long wavelength VCSEL 96 and the top and bottom mirrors 98, 100 of the short wavelength VCSEL 94 are from the GaAs/AlGaAs system. The top mirror 102 of the long-wavelength VCSEL 96 is grown in the same epitaxial growth step as the short wavelength VCSEL 94. Fabrication of the apparatus employs one wafer-fusion step between the top long-wavelength mirror 102 and the long wave-length active-absorber medium 106. The long-wavelength active-absorber medium 106 comprises materials selected from the group InP (Indium Phosphide), InGaAsP (Indium Gallium Arsenide Phosphide), and InGaAlAs (Indium gallium aluminum arsenide).

Current constriction in the short-wavelength VCSEL 94 is achieved by lateral oxidation 108 with $Al_xGa_yO_z$. The long-wavelength VCSEL 96 is index-guided by etching grooves 110 in the top long wavelength mirror prior to wafer fusion 111 with the active-absorber medium 106. It is also possible that the long-wavelength VCSEL 96 can be index-guided through lateral oxidation.

The short wavelength VCSEL 94 is bottom-emitting, while the long-wavelength VCSEL 96 can be either top-emitting or bottom emitting. Both the p and n metal contacts 112, 114 to the short wavelength VCSEL 94 are made above rather than below the long-wavelength VCSEL 96. A long-wavelength anti-reflection coating 115 is applied to the top short wavelength mirror 98.

Figure 6:
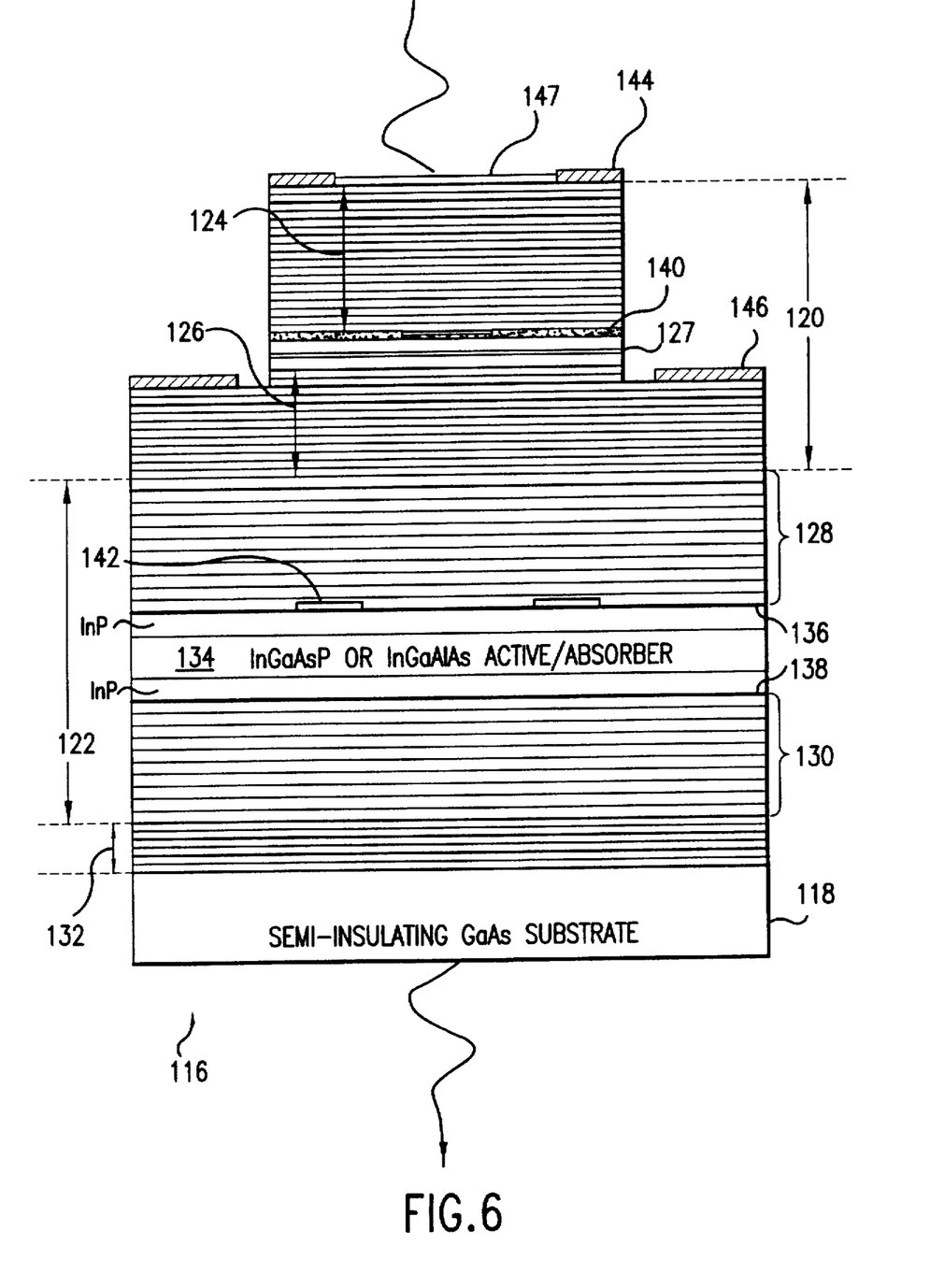
FIG. 6 is a schematic representation of an optically pumped long wavelength VCSEL with a metal bonded mirror according to the principles of the invention.

Referring to FIG. 6, a laser 116 includes a GaAs substrate 118. A short wavelength VCSEL 120 emitting in the wavelength range 700 nm–1050 nm optically pumps a longer wavelength (1250nm–1650nm) VCSEL 122. The short wavelength VCSEL 120 includes a top mirror 124, a bottom mirror 126 and a short wavelength active region 127 interposed between the top mirror 124 and the bottom mirror 126. The long wavelength VCSEL 122 includes a top mirror 128 and a bottom mirror 130. The bottom mirror 130 of the long-wavelength VCSEL 122 is preferably a wafer-fused GaAs/AlGaAs mirror; but can be a metal-bonded GaAs/AlGaAs mirror, or an epitaxially-grown InP/InGaAsP or InP/InGaAlAs mirror. All the remaining mirrors 124, 126, 128 in the laser 116 are from the GaAs/AlGaAs system. The top mirror 128 of the long-wavelength VCSEL 122 is grown in the same epitaxial growth step as the short wavelength VCSEL 120. An optional short wavelength mirror 132 can be disposed below the bottom long wavelength mirror 130 for double-pass absorption.

The top mirror 128 of the long wavelength VCSEL 122 is attached to the long-wavelength active-absorber medium 134 by metal (e.g., preferably palladium 136) bonding. The palladium bond 136 defines an aperture through which light can pass. The bottom mirror 130 is wafer fused 138 to the active-absorber medium 134. The long-wavelength active-absorber medium 134 comprises materials selected from the group consisting of InP (Indium Phosphide), InGaAsP (Indium Gallium Arsenide Phosphide), and InGaAlAs (Indium gallium aluminum arsenide).

The short-wavelength VCSEL 120 has current confinement provided by lateral oxidation 140 with $Al_xGa_yO_z$. The long-wavelength VCSEL 122 is index-guided by grooves 142 patterned in the long wavelength mirror 128 prior to wafer fusion or metal bonding of the top long wavelength mirror 128 and the active-absorber medium 134.

The short wavelength VCSEL 120 is bottom-emitting while the long-wavelength VCSEL 122 can be either top-emitting or bottom-emitting. Both p and n metal contacts 144,146 to the short wavelength VCSEL 120 are made above rather than below the long-wavelength VCSEL 122. A long-wavelength anti-reflection coating 147 is applied to the top short-wavelength mirror 124.

Figure 7:
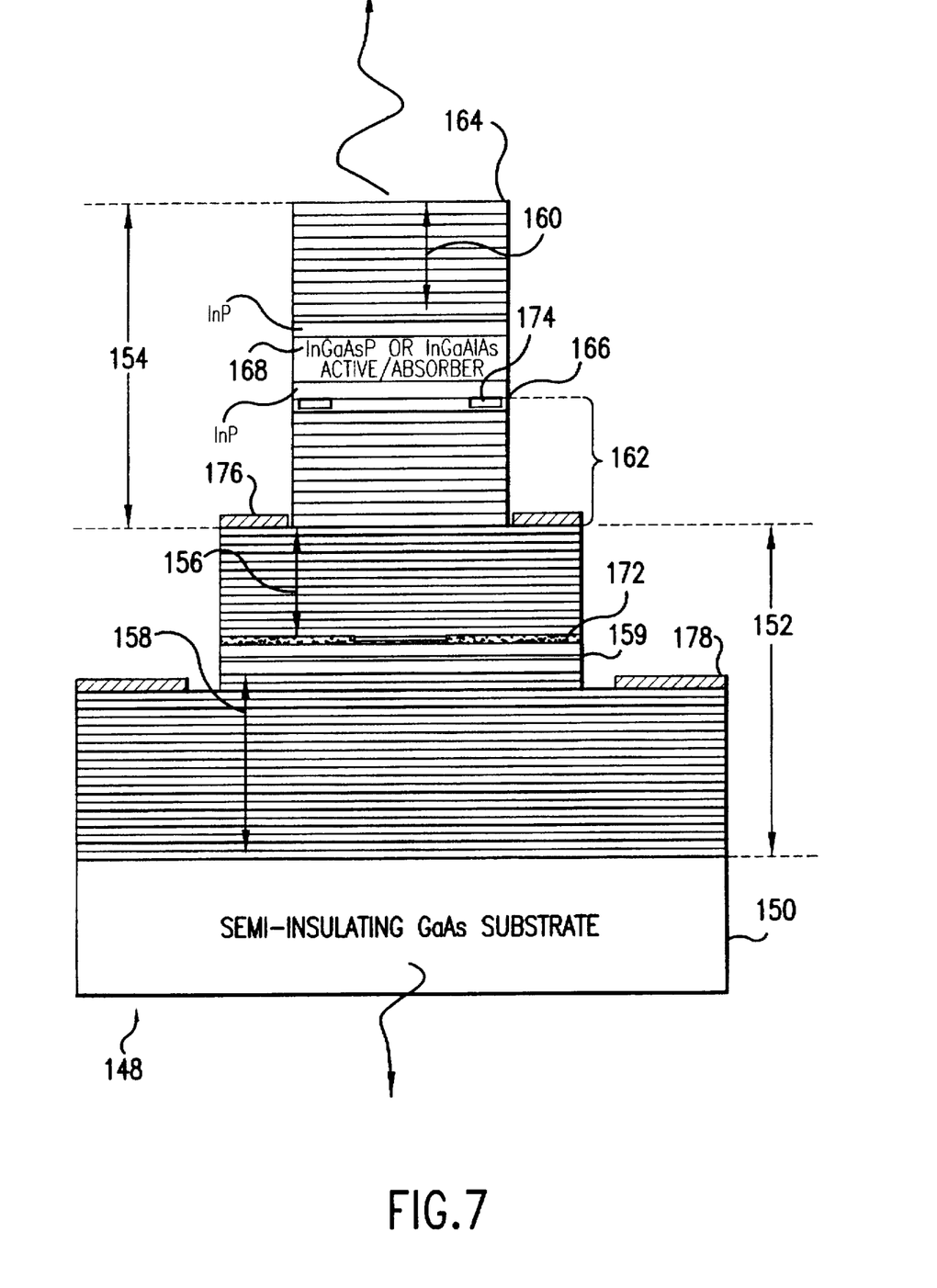
FIG. 7 is a schematic representation of an optically pumped long wavelength VCSEL with a top emission short wavelength pump VCSEL according to the principles of the invention.

Referring to FIG. 7, a laser 148 includes a GaAs substrate 150. A short wavelength VCSEL 152 emits radiation in the wavelength range 700 nm–1050 nm to optically pump a longer wavelength VCSEL 154 which emits radiation in the 1250 nm–1650 nm range. The short wavelength VCSEL 152 includes a top mirror 156, a bottom mirror 158 and a short wavelength active region 159. The long wavelength VCSEL 154 includes a top mirror 160 and a bottom mirror 162. Mirrors 156,158,162 of laser 148 are from the GaAs/AlGaAs system. Top long-wavelength mirror 160 can be (1) a wafer-fused or metal-bonded GaAs/AlGaAs mirror, (2) an epitaxially-grown InP/InGaAsP or InP/InGaAlAs mirror, or (3) a sputtered or evaporated dielectric mirror. Any of these three mirror designs can also include a metal reflector 164 at the top of the mirror stack to increase reflectivity. The bottom mirror 162 of the long-wavelength VCSEL 154 is grown in the same epitaxial growth step as the short wavelength VCSEL 152.

Laser fabrication can employ one or two wafer fusion steps. A wafer-used interface 166 is depicted between the long wavelength active-absorber medium 168 and the bottom long wavelength mirror 162. The long-wavelength active-absorber medium 168 consists of materials selected from the group consisting of InP (Indium Phosphide), InGaAsP (Indium Gallium Arsenide Phosphide), and InGaAlAs (Indium gallium aluminum arsenide).

Current confinement is achieved in the short wavelength VCSEL 152 by lateral oxidation using $Al_xGa_yO_z$ 172, but can also be achieved by ion implantation. The long-wavelength VCSEL 154 is index-guided by etching grooves 174 prior to the wafer fusion or metal bonding of the bottom long wavelength mirror 162 and the long wavelength active-absorber medium 168.

The short wavelength VCSEL 152 is top-emitting (i.e., emitting a majority of power away from substrate 150), while the long-wavelength VCSEL 154 can be either top-emitting or bottom emitting. Both p and n metal contacts 176, 178 to the short wavelength VCSEL 152 are made below the long-wavelength VCSEL 154.

Optically pumped VCSELs according to the principles of the invention have the advantages of wafer-scale fabrication and testing, and inexpensive one and two dimensional array fabrication. Optical pumping does not require electrical contacts to the longer wavelength cavity, so that fabrication is much simpler than electrical pumping and resistive heating does not occur. The cavity in optical pumping schemes can be free of dopants, which are a major source of optical loss in VCSELs utilizing electrical injection.

Although preferred and alternative embodiments of the invention have been described and illustrated, it is clear that the invention is susceptible to numerous modifications and adaptations within the ability of those skilled in the art and without the exercise of inventive faculty. Thus, it should be understood that various changes in form, detail, and usage of the present invention may be made without departing from the spirit and scope of the invention.

What is claimed is:

1. An optically-pumped long-wavelength laser, comprising:

a long wavelength vertical cavity surface emitting laser (VCSEL), the long wavelength VCSEL having a long wavelength active-absorber medium interposed between a top long wavelength mirror and a bottom long wavelength mirror, the long wavelength VCSEL emitting radiation at a first wavelength in a range from 1250 nm to 1650 nm; and an electrically-pumped, short wavelength VCSEL optically coupled to the long wavelength VCSEL for optically pumping the long wavelength VCSEL, the short wavelength VCSEL emitting radiation at a second wavelength in a range from 700 nm to 1050 nm.

2. The laser of claim 1, wherein one of the top long wavelength mirror and the bottom long wavelength mirror is grown in an epitaxial growth step with the short wavelength VCSEL.

3. The laser of claim 2, wherein the long wavelength VCSEL has an optical mode defined by a lateral refractive index variation.

4. The laser of claim 2, wherein:

the short wavelength VCSEL includes a top short wavelength mirror and a bottom short wavelength mirror; and the top and bottom long wavelength mirrors and the top and bottom short wavelength mirrors are each fabricated from the GaAs/AlGaAs system.

5. The laser of claim 2, further comprising a first wafer-fused interface between one of the top and bottom long wavelength mirrors and the long wavelength active-absorber medium.

6. The laser of claim 5, further comprising a second wafer-fused interface between the long wavelength active-absorber medium and one of the top and bottom long wavelength mirrors.

7. The laser of claim 2, wherein the long wavelength active-absorber medium comprises a compound selected from the group consisting of InP, InGaAsP, and InGaAlAs.

8. The laser of claim 1, further comprising:

grooves etched into one of the top and bottom long wavelength mirrors to index-guide the long wavelength VCSEL; and one of the top and bottom long wavelength mirrors is wafer-fused to the long wavelength active-absorber medium after etching said grooves.

9. The laser of claim 1, further comprising:

grooves etched into one of the top and bottom long wavelength mirrors to index-guide the long wavelength VCSEL; and one of the top and bottom long wavelength mirrors is metal-bonded to the long wavelength active-absorber medium after etching said grooves.

10. The laser of claim 2, wherein the short wavelength VCSEL is index-guided through lateral oxidation.

11. The laser of claim 2, wherein the short wavelength VCSEL is index-guided through chemical etching.

12. The laser of claim 2, wherein the short wavelength VCSEL is bottom-emitting, and positioned above the long-wavelength VCSEL.

13. The laser of claim 12, wherein:

the bottom long wavelength mirror is fabricated from a system selected from the group consisting of InP/InGaAsP and InP/InGaAlAs, and is grown in the same epitaxial step as the long wavelength active-absorber medium; and the long wavelength active-absorber medium is disposed above the bottom long wavelength mirror.

14. The laser of claim 12, wherein the bottom long wavelength mirror is a GaAs/AlGaAs mirror, and is wafer-fused to the long wavelength active-absorber medium.

15. The laser of claim 12, wherein the bottom long wavelength mirror is a GaAs/AlGaAs mirror, and is metal-bonded to the long wavelength active-absorber medium.

16. The laser of claim 2, wherein the short-wavelength VCSEL is top-emitting and is positioned below the long-wavelength VCSEL.

17. The laser of claim 16, wherein the top long wavelength mirror is a GaAs/AlGaAs mirror, and is wafer-fused to the long wavelength active-absorber medium.

18. The laser of claim 16, wherein the top long wavelength mirror is an epitaxially grown InP/InGaAsP mirror.

19. The laser of claim 16, wherein the top long wavelength mirror is an epitaxially grown InP/InGaAlAs mirror.

20. The laser of claim 16, wherein the top long-wavelength mirror is a sputtered dielectric mirror.

21. The laser of claim 16, wherein the top long-wavelength mirror is an evaporated dielectric mirror.

22. The laser of claim 1, further comprising an ion implantation region in the short wavelength VCSEL for current confinement.

23. A method of stimulating emission in a long wavelength vertical cavity surface emitting laser (VCSEL) causing radiation at a first wavelength in a range from 1250 nm to 1650 nm to be emitted by the long wavelength VCSEL, comprising the following step:

injecting radiation into the long wavelength VCSEL at a second wavelength in a range from 700 nm to 1050 nm with a short wavelength VCSEL, which is optically coupled to the long wavelength VCSEL.

* * * * *